(12) United States Patent
Katsurayama et al.

(10) Patent No.: US 7,838,984 B2
(45) Date of Patent: Nov. 23, 2010

(54) ADHESIVE TAPE, CONNECTED STRUCTURE AND SEMICONDUCTOR PACKAGE

(75) Inventors: Satoru Katsurayama, Tokyo (JP); Tomoe Yamashiro, Tokyo (JP); Tetsuya Miyamoto, Tokyo (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 528 days.

(21) Appl. No.: 11/885,351

(22) PCT Filed: Apr. 25, 2007

(86) PCT No.: PCT/JP2007/000457

§ 371 (c)(1),
(2), (4) Date: Feb. 28, 2008

(87) PCT Pub. No.: WO2008/023452

PCT Pub. Date: Feb. 28, 2008

(65) Prior Publication Data

US 2010/0059872 A1    Mar. 11, 2010

(30) Foreign Application Priority Data

Aug. 25, 2006 (JP) .............................. 2006-229919

(51) Int. Cl.
*H01L 23/14* (2006.01)
(52) U.S. Cl. .............................. 257/702; 257/E23.068; 257/E23.116; 257/E23.001
(58) Field of Classification Search ................. 438/119; 257/702, E21.5, E21.512, E21.514, E21.519, 257/E23.068, E23.116, E23.001; 156/330
See application file for complete search history.

(56) References Cited

U.S. PATENT DOCUMENTS

| 7,713,787 | B2* | 5/2010 | Kojima et al. ............... 438/116 |
| 2008/0142966 | A1* | 6/2008 | Hirano et al. ............... 257/737 |
| 2008/0207814 | A1* | 8/2008 | Wrosch et al. ............... 524/440 |

FOREIGN PATENT DOCUMENTS

| JP | 61-276873 | 12/1986 |
| JP | 4-262890 | 9/1992 |
| JP | 2003-128874 | 5/2003 |
| JP | 2004-186204 | 7/2004 |
| JP | 2004-260131 | 9/2004 |
| JP | 2004-288814 | 10/2004 |
| JP | 2004-292821 | 10/2004 |
| JP | 2004-349495 | 12/2004 |
| JP | 2005-194306 | 7/2005 |
| JP | 2005-276925 | 10/2005 |

* cited by examiner

*Primary Examiner*—Caridad M Everhart
(74) *Attorney, Agent, or Firm*—Smith, Gambrell & Russell, LLP

(57) ABSTRACT

An adhesive tape 101 electrically connecting conductive components includes a resin layer 132 containing a thermosetting resin, a solder powder 103 and a curing agent. The solder powder 103 and the curing agent reside in the resin layer 132, the curing temperature $T_1$ of the resin layer 132 and the melting point $T_2$ of the solder powder 103 satisfy $T_1 \geq T_2 + 20°$ C., wherein the resin layer 132 shows a melt viscosity of 50 Pa·s or above and 5000 Pa·s or below, at the melting point $T_2$ of the solder powder 103.

11 Claims, 4 Drawing Sheets

ADHESIVE TAPE, CONNECTED STRUCTURE AND SEMICONDUCTOR PACKAGE

TECHNICAL FIELD

The present invention relates to an adhesive tape, a connected structure and a semiconductor package.

BACKGROUND ART

As an adhesive tape used for connection between conductive components such as electrodes, there has been known an adhesive tape containing solder particles (Patent Document 1). Patent Document 1 describes an anisotropic conductive film (ACF) containing solder particles as the conductive particles.

In Patent Document 2, there is described a method of interconnecting terminals using a conductive adhesive containing a conductive particles composed of an alloy having a Sn/In composition, and an epoxy-base resin component.

Patent Document 3 describes manufacturing of an adhesive by mixing solder balls, a flux agent such as malic acid and an epoxy resin, and then coating the adhesive on a polyimide circuit board having a metallized pattern formed thereon.

[Patent Document 1] Japanese Laid-Open Patent Publication No. 61-276873

[Patent Document 2] Japanese Laid-Open Patent Publication No. 2004-260131

[Patent Document 3] Japanese Laid-Open Patent Publication No. 4-262890

DISCLOSURE OF THE INVENTION

Problem to be Solved by the Invention

However, all of the adhesive tape of Patent Document 1, the conductive adhesive of Patent Document 2, and the adhesive of Patent Document 3 cannot always ensure low resistivity stably at bonded portions, leaving a room for further improving connection reliability.

It is therefore an object of the present invention to provide an adhesive tape capable of stably realizing low resistivity, and to further provide a connected structure and a semiconductor package using the adhesive tape.

Means for Solving Problem

According to the present invention, there is provided an adhesive tape electrically connecting conductive components, which includes:

a resin layer containing a thermosetting resin;
a solder powder; and
a curing agent,
wherein the solder powder and the curing agent reside in the resin layer,
the curing temperature $T_1$ of the resin layer and the melting point $T_2$ of the solder powder satisfy the relational expression (1):

$$T_1 \geq T_2 + 20° C. \qquad \text{expression (1)}$$

where the curing temperature $T_1$ is defined as an exothermic peak temperature obtained by measuring the adhesive tape by DSC at a temperature elevation speed of 10° C./minute, and the resin layer shows a melt viscosity of 50 Pa·s or above and 5000 Pa·s or below, at the melting point $T_2$ of the solder powder.

When the conductive components are connected using the adhesive tape of the present invention, the adhesive tape is placed between the conductive components, followed by heating at a predetermined temperature. The solder powder melts by heating, and the melted solder powder migrates through the resin layer to reach the surface of the conductive components in a self-aligned manner. By virtue of good wettability of solder with respect to metals, it can migrate to the surface of the conductive components in a self-aligned manner. The surface of the conductive components and the solder powder are consequently bonded with each other, and thereby the conductive components are electrically connected.

Because of difficulty in controlling curing behavior of the resin, the adhesive tape described in Patent Document 1 is supposed to be unsuccessful in disposing the conductive particles between the conductive components, and is consequently supposed to increase resistivity of bonding.

In contrast, by virtue of the curing agent contained therein, the present invention can control curing characteristics of the resin layer containing a thermosetting resin. Because the melt viscosity of the resin layer at the melting point $T_2$ of the solder powder is adjusted to 50 Pa·s or above, the molten solder under heating is allowed to migrate through the resin layer, and to concentrate between the conductive components.

Because the melt viscosity of the resin layer at the melting point $T_2$ of the solder powder is adjusted to 5000 Pa·s or below, the solder is also successfully prevented from escaping from between the conductive components.

It was also difficult for the adhesive described in Patent Document 2, and the adhesive described in Patent Document 3 to effectively concentrate the solder between the conductive components, and thereby the resistivity of bonding has Occasionally elevated.

In contrast, because the curing temperature $T_1$ of thermosetting resin and the melting point $T_2$ of the solder powder satisfy the relation expressed by $T_1 \geq T_2 + 20°$ C., the present invention allows the solder powder melted under heating to smoothly migrate through the resin layer before being cured. The solder powder can consequently be concentrated between the conductive components.

In addition, because the melt viscosity of the resin layer at the melting point $T_2$ of the solder powder is adjusted to 50 Pa·s or above as described in the above, the molten solder under heating is allowed to migrate through the resin layer, and to concentrate between the conductive components.

Because the melt viscosity of the resin layer at the melting point. $T_2$ of the solder powder is adjusted to 5000 Pa·s or below as described in the above, the solder which resides between the conductive components is also successfully prevented from escaping from between the conductive components.

The adhesive of the present invention is made readily handleable because it is given in a form of tape, and can thereby simplify bonding process between the conductive components.

Content of the solder powder is preferably 20 parts by weight or more per 100 parts by weight in total of all components other than the solder powder.

By adjusting the content of the solder powder to 20 parts by weight or more per 100 parts by weight in total of all components other than the solder powder, the conductive components can exactly be connected with the aid of the solder powder concentrated between the conductive components.

Moreover, mean particle size of the solder powder is preferably 1 μm or larger and 100 μm or smaller.

By adjusting the mean particle size of the solder powder to 1 μm or larger, the solder powder can exactly be concentrated on the surface of the conductive components.

By adjusting the mean particle size of the solder powder to 100 μm or smaller, the solder powder is successfully prevented from bridging the adjacent conductive components, and thereby from short-circuiting the adjacent conductive components.

The thermosetting resin preferably contains a solid epoxy resin at room temperature, and a liquid epoxy resin at room temperature.

Among others, the epoxy resin which exists as a solid at room temperature preferably contains a solid tri-functional epoxy resin and a cresol-novolac-type epoxy resin, and the epoxy resin which exists as a liquid at room temperature is preferably a bisphenol-A-type epoxy resin or a bisphenol-F-type epoxy resin.

By configuring the thermosetting resin as containing an epoxy resin which exists as a solid at room temperature and an epoxy resin which exists as a liquid at room temperature, the resin can be raised in the degree of freedom in designing the melt viscosity. More specifically, the melt viscosity of the resin layer containing the thermosetting resin at the melting point $T_2$ of the solder powder can readily be adjusted to 50 Pa·s or above and 5000 Pa·s or below.

It is further preferable that the curing agent is a curing agent having a flux activity.

By making such activating agent having a flux activity contained in the resin layer, the curing agent having a flux activity can effectively migrate towards the interface between the conductive components and the solder. The curing agent can remove an oxidized layer on the surface of the solder powder, and can thereby improve wettability of the solder powder. As a consequence, contact resistivity between the conductive components can exactly be lowered.

Use of the curing agent having a flux activity can also get rid of a process for flux cleaning, and can thereby simplify the manufacturing process and can save the costs.

Moreover, the curing agent having a flux activity is preferably a curing agent containing carboxyl group(s).

According to the present invention, there is also provided a connected structure using the above-described adhesive tape. More specifically, the connected structure of the present invention is such as having a pair of conductive components; and an adhesive tape disposed between the pair of conductive components so as to electrically connect the pair of conductive components, wherein the adhesive tape is the above-described adhesive tape, and 50% or more of the carboxyl group of the curing agent having a flux activity has reacted with thermosetting resin.

Presence of thermosetting resin and a large amount of unreacted curing agent having a flux activity may sometimes result in corrosion of the conductive components, typically when the connected structure was stored at high temperatures.

In contrast, in the connected structure of the present invention, 50% or more of the carboxyl group of the curing agent having a flux activity has already reacted with thermosetting resin, so that the conductive components can be prevented from corroding, even when, for example, the connected structure was stored at high temperatures.

Advantage of the Invention

According to the present invention, there is provided an adhesive tape capable of stably realizing low resistivity, and to further provide a connected structure and a semiconductor package using the adhesive tape.

BRIEF DESCRIPTION OF THE DRAWINGS

The above and other objects, features and advantages described in the above will be more apparent from the preferred embodiments given below, and accompanying drawings, in which.

REFERENCE NUMERALS

Figure 1:
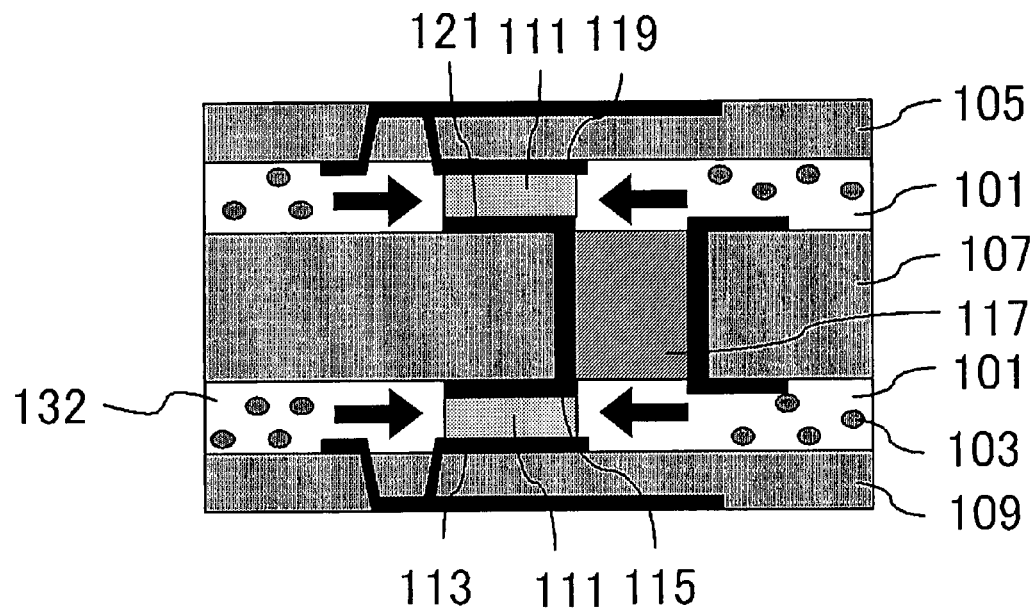
FIG. 1 is a sectional view explaining a method of bonding using the adhesive tape according to an embodiment.

101 ADHESIVE TAPE
103 SOLDER POWDER
105 THIRD SUBSTRATE
107 SECOND SUBSTRATE
109 FIRST SUBSTRATE
111 SOLDER REGION
113 FIRST ELECTRODE
115 SECOND ELECTRODE
117 VIA
119 THIRD ELECTRODE
121 SECOND ELECTRODE
131 SECOND BASE
132 RESIN LAYER
133 FIRST BASE
135 SECOND ELECTRODE
137 FIRST ELECTRODE
139 SECOND SOLDER RESIST LAYER
141 FIRST SOLDER RESIST LAYER
143 SPACE
151 FIRST SEMICONDUCTOR CHIP
153 SECOND SEMICONDUCTOR CHIP
155 MOUNTING SUBSTRATE
157 SUBSTRATE
159 WIRE
161 BUMP ELECTRODE
163 MOLDING RESIN
165 BUMP ELECTRODE
167 RESIN
169 WIRE
171 WIRE

BEST MODES FOR CARRYING OUT THE INVENTION

Paragraphs below will explain embodiments of the present invention, referring to the attached drawings.

The adhesive tape of the present invention is an adhesive tape electrically connecting conductive components which includes:

a resin layer containing a thermosetting resin;
a solder powder; and
a curing agent,
wherein the solder powder and the curing agent reside in the resin layer,
the curing temperature $T_1$ of the resin layer and the melting point $T_2$ of the solder powder satisfy the relational expression (1)

$$T_1 \geq T_2 + 20° \text{ C.} \qquad \text{expression (1)}$$

where the curing temperature $T_1$ is defined as an exothermic peak temperature obtained by measuring the adhesive tape by DSC at a temperature elevation speed of 10° C./minute, and
the resin layer shows a melt viscosity of 50 Pa·s or above and 5000 Pa·s or below, at the melting point $T_2$ of the solder powder.

The individual components will more specifically be explained.

The resin layer of the adhesive tape preferably contains a thermoplastic resin, in addition to the thermosetting resin. A mixed system of the thermoplastic resin and the thermosetting resin is preferable, from the viewpoints of film forming property and melt viscosity of the resin.

The thermoplastic resin is not specifically limited, wherein typical examples include phenoxy resin, polyester resin, polyurethane resin, polyimide resin, siloxane-modified polyimide resin, polybutadiene, polypropylene, styrene-butadiene-styrene copolymer, styrene-ethylene-butylene-styrene copolymer, polyacetal resin, poly(vinyl butyral) resin, poly(vinyl acetal) resin, butyl rubber, chloroprene rubber, polyamide resin, acrylonitrile-butadiene copolymer, acrylonitrile-butadiene-acrylic acid copolymer, acrylonitrile-butadiene-styrene copolymer, poly(vinyl acetate), nylon, and acrylic rubber. These may be used independently, or in a mixed form of two or more species.

As the thermoplastic resin, those having nitrile groups, epoxy groups, hydroxyl groups and carboxyl groups may be used for the purpose of improving adhesiveness and compatibility with other resin, wherein acrylic rubber may typically be used as this sort of resin.

There is no special limitation on the thermosetting resin, wherein epoxy resin, oxetane resin, phenol resin, (meth)acrylate resin, unsaturated polyester resin, diallyl phthalate resin, maleimide resin are typically used. Among these, epoxy resin excellent in curability, storability, and showing excellent heat resistance, moisture resistance and chemical resistance after cured, is preferably used.

Either of epoxy resin which exists as a solid at room temperature, and epoxy resin which exists as a liquid at room temperature may be used as the epoxy resin. It is also allowable that the resin contains both of the epoxy resin which exists as a solid at room temperature, and the epoxy resin which exists as a liquid at room temperature. This configuration can further improve the degree of freedom in designing melting behavior of the resin.

The epoxy resin which exists as a solid at room temperature is not specifically limited, and can be exemplified by bisphenol-A-type epoxy resin, bisphenol-S-type epoxy resin, phenol novolac-type epoxy resin, cresol-novolac-type epoxy resin, glycidyl amine type epoxy resin, glycidyl ester type epoxy resin, tri-functional epoxy resin, and tetra-functional epoxy resin. More specifically, it may contain a solid tri-functional epoxy resin and a cresol-novolac-type epoxy resin. The solid tri-functional epoxy resin and the cresol-novolac-type epoxy resin can be exemplified by 2-[4-(2,3,epoxy propoxy)phenyl]-2-[4[1,1-bis[4-(2,3-epoxy propoxy)phenyl]ethyl]phenyl]propane, and 1,3-bis[4-[1-[4-(2,3epoxy propoxy)phenyl]-1-[4-[1-[4-(2,3-epoxy propoxy)phenyl]-1-methyl]ethyl]phenyl]phenoxy]-2-propanol, which are used in Examples described later.

The epoxy resin which exists as a liquid at room temperature may be a bisphenol-A-type epoxy resin or a bisphenol-F-type epoxy resin. They may be used in combination with each other.

The epoxy resin which exists as a solid at room temperature may contain a solid tri-functional epoxy resin and a cresol-novolac-type epoxy resin, and the epoxy resin which exists as a liquid at room temperature may be a bisphenol-A-type epoxy resin or a bisphenol-F-type epoxy resin.

As a specific example of the mixed system of the thermoplastic resin and the thermosetting resin, a configuration such that the resin contains an epoxy resin and an acrylic rubber can be exemplified. By configuring the adhesive tape as containing an acrylic rubber, stability in manufacturing of the adhesive tape in a film form can be improved. The configuration can also improve the adhesiveness of the adhesive tape onto an object to be bonded, because the adhesive tape is decreased in the elastic modulus, and reduced in residual stress between the object to be bonded and the adhesive tape.

As for content of the thermoplastic resin in the adhesive tape of the present invention, content of acrylic rubber, for example, is adjusted to 10% by weight or more and 50% by weight or less of the total content of all other constituents, but excluding the solder powder, of the adhesive tape. By adjusting the content of acrylic rubber to 10% by weight or more, degradation in film forming property can be suppressed, increase in the elastic modulus of the adhesive tape after cured can be suppressed, and thereby the adhesiveness with an object to be bonded can further be improved. On the other hand, by adjusting the content of acrylic rubber to 50% by weight or less, increase in melt viscosity of the resin can be suppressed, and thereby the solder powder is allowed to migrate towards the surface of the conductive components in a more exact manner.

Content of epoxy resin as the thermosetting resin is adjusted typically to 20% by weight or more and 80% by weight or less of the total content of all other constituents, but excluding the solder powder, of the adhesive tape. By adjusting the content of epoxy resin to 20% by weight or more, the elastic modulus attained after adhesion can be ensured in a more reliable manner, and can thereby further improve the connection reliability. On the other hand, by adjusting the content of epoxy resin to 80% by weight or less, the resin can further be raised in the melt viscosity, and can thereby suppress degradation in the connection reliability due to flowing of the solder powder out from an object to be bonded.

As another example of the mixed system of the thermoplastic resin and the thermosetting resin, a configuration in which the resin contains an epoxy resin and a phenoxy resin can be exemplified. This configuration can achieve both of heat resistance and moisture resistance after curing in a more preferable manner.

Specific examples of the epoxy resin can be exemplified by the materials described in the above.

Specific examples of the phenoxy resin can be exemplified by those of bisphenol-A type, bisphenol-F type, bisphenol-S type, and those having a fluorene backbone.

In view of improving film forming property of the adhesive tape, content of phenoxy resin in the resin is adjusted typically to 10% by weight or more, and preferably 15% by weight or more of the total content of all other constituents, but excluding the solder powder, of the adhesive tape. By this adjustment, the adhesiveness ascribable to hydroxyl groups contained in the phenoxy resin can be ensured to a still better degree. In view of suppressing excessive increase in the melt viscosity of the resin, and of allowing the solder powder to migrate towards the surface of the conductive components in a more exact manner, the content of phenoxy resin relative to the total content of the constituents, excluding the solder powder, of the adhesive tape is adjusted typically to 50% by weight or less, and preferably 40% by weight or less.

As described previously, in this embodiment, the curing temperature $T_1$ of the resin layer and the melting point $T_2$ of the solder powder satisfy the relational expression of $T_1 \geqq T_2 + 20°$ C.

More preferably, the curing temperature $T_1$ of the resin layer is (melting point $T_2$ of solder powder)+30° C. or above, more preferably the curing temperature $T_1$ of the resin layer is (melting point $T_2$ of solder powder)+45° C. or above, and still more preferably the curing temperature $T_1$ of the resin layer is (melting point $T_2$ of solder powder)+50° C. or above.

By satisfying $T_1 \geqq T_2 + 20°$ C., the molten solder powder, under heating is allowed to smoothly migrate through the resin layer before being cured. The solder powder can therefore be concentrated between the conductive components.

By adjusting the curing temperature $T_1$ of the resin layer to (melting point $T_2$ of solder powder)+30° C. or above, more preferably to (melting point $T_2$ of solder powder)+45° C. or above, and still more preferably to (melting point $T_2$ of solder powder)+50° C. or above, the solder powder is successfully prevented from bridging the adjacent conductive components, and thereby from short-circuiting the adjacent conductive components, in addition to the above-described effects.

Moreover, the curing temperature $T_1$ of the resin layer is (melting point $T_2$ of solder powder)+100° C. or below, and more preferably (melting point $T_2$ of solder powder)+80° C. or below. By this configuration, the molten solder powder is allowed to smoothly migrate through the resin layer before being cured.

The curing temperature $T_1$ of the resin layer herein is an exothermic peak temperature obtained when the adhesive tape is measured using a DSC (differential scanning calorimeter), at a temperature elevation speed of 10° C./minute.

The melting point $T_2$ of the solder powder herein is defined as an endothermic peak temperature obtained when the solder powder alone is measured using, for example, a DSC at a temperature elevation speed of 10° C./minute.

The melt viscosity of the resin layer at the melting point $T_2$ of the solder powder is 50 Pa·s or above, and 5000 Pa·s or below.

Because the melt viscosity of the resin layer at the melting point $T_2$ of the solder powder is adjusted to 50 Pa·s or above, the molten solder under heating is allowed to migrate through the resin layer, and can be concentrated between the conductive components.

It is particularly preferable that the melt viscosity of the resin layer at the melting point $T_2$ of the solder powder is 100 Pa·s or above. By adjusting the melt viscosity of the resin layer at the melting point $T_2$ of the solder powder to 100 Pa·s or above, in addition to the effect of concentrating the solder between the conductive components, it is made possible, for the case where the conductive components are used as electrodes provided on substrates, to suppress swelling of the resin layer and the solder powder out from the upper and lower connection substrates, and thereby to prevent non-conformities related to connection reliability, such as insulation failure.

Because the melt viscosity of the resin layer at the melting point $T_2$ of the solder powder is adjusted to 5000 Pa·s or below, the solder is successfully prevented from escaping from between the conductive components.

The melt viscosity of the resin layer at the melting point $T_2$ of the solder powder herein is particularly preferably 4000 Pa·s or below. By adjusting the melt viscosity of the resin layer at the melting point $T_2$ of the solder powder to 4000 Pa·s or below, a sufficient wettability onto an object to be bonded can be ensured by virtue of appropriate fluidization of the resin layer, and thereby a sufficient level of adhesiveness can be obtained, in addition to an effect of preventing the solder from escaping from between the conductive components.

The melt viscosity of the resin layer can be measured using a sample of the adhesive tape adjusted to 100 μm thickness, using a dynamic viscoelastometer at a frequency of 0.1 Hz, and at a temperature elevation speed of 10° C./minute.

In the adhesive tape of the present invention, lead-free solder, for example, can be used as the solder composing the solder powder. The lead-free solder is not specifically limited, but is preferably an alloy containing at least two or more elements selected from the group consisting of Sn, Ag, Bi, In, Zn and Cu. Among others, Sn-containing alloys such as Sn—Bi alloy, Sn—Ag—Cu alloy and Sn—In alloy are preferable when melting point and mechanical properties are taken into consideration.

In view of ensuring a sufficient level of fluidity of the resin in the process of adhering the adhesive tape, the melting point $T_2$ of the solder powder is adjusted typically to 100° C. or above, and preferably 130° C. or above. In view of suppressing, in the process of bonding, degradation of elements provided on objects to be bonded such as substrates and chips, the melting point $T_2$ of the solder powder is typically adjusted to 250° C. or below, and preferably 230° C. or below.

Mean particle size of the solder powder can be set depending on the surface area of the conductive components and the distance between the conductive components, and is preferably adjusted to 1 μm or above, and 100 μm or below. In view of allowing the solder powder to exactly concentrate to the surface of the conductive components, the mean particle size of the solder powder is adjusted typically to 5 μm or above, and more preferably 10 μm or above. In view of selectively forming solder regions on the surface of the conductive components, and of ensuring insulation of the adhesive tape in the region other than the region where electric conduction is required such as electrode-forming region, the mean particle size of the solder powder is adjusted typically to 100 μm or below, and preferably 50 μm or below. The mean particle size of the solder powder herein can be measured typically by laser diffraction scattering.

By adjusting the mean particle size of the solder powder to 1 μm or above, the solder powder is allowed to exactly concentrate onto the surface of the conductive components.

By adjusting the mean particle size of the solder powder to 100 μm or less, the solder powder is successfully prevented from bridging the adjacent conductive components, and thereby from short-circuiting the adjacent conductive components.

In the adhesive tape of the present invention, content of the solder powder, per 100 parts by weight in total of all components, but excluding the solder powder, is adjusted to 20 parts by weight or more, and preferably 40 parts by weight or more, in view of improving connection reliability. In view of improving film forming property of the adhesive tape, the content of the solder powder, per 100 parts by weight in total of all components, but excluding the solder powder, of the adhesive tape is adjusted to 250 parts by weight or less, and preferably 230 parts by weight or less.

In the adhesive tape of the present invention, the content of the solder powder per 100 parts by weight in total of all components, but excluding the solder powder, may be adjusted to 20 parts by weight or more, and at the same time, the mean particle size of the solder powder may be 1 μm or above and 100 μm or below. By this configuration, it is made possible to further improve a balance among selectively forming the solder region on the surface of the conductive components, ensuring insulation in the region other than the region where electric conduction is required such as electrode-forming region, and film forming property of the adhesive tape.

The curing agent having a flux activity used in the present invention is a compound exerting an action of reducing an oxidized film on the surface of the solder powder to as enough as allowing electrical contact with the conductive components, and having a functional group bondable to the resin. For an exemplary case where the resin contains an epoxy resin, the curing agent having a flux activity may have a carboxyl group, and a group reactive with the epoxy group. The group reactive with the epoxy group can be exemplified by carboxyl group, hydroxyl group, amino group and so forth.

The curing agent having a flux activity may appropriately be selected and used, depending on species of the solder powder, in view of removing the oxidized film on the surface of the solder powder in the process of bonding.

The curing agent having a flux activity is a compound having, for example, carboxyl group(s). The compound containing carboxyl group(s) can be exemplified by carboxylic acids such as straight-chain or branched-chain alkyl carboxylic acid, aromatic carboxylic acid, and so forth.

As the alkyl carboxylic acid, compounds expressed by the formula (1) below can specifically be exemplified:

$$\text{HOOC}-(\text{CH}_2)_n-\text{COOH} \quad (1)$$

In the above formula (1), n is an integer from 0 to 20, both ends inclusive.

Taking a balance among flux activity, out gas in the process of bonding, and elastic modulus and glass transition point of the adhesive tape after being cured, n in the above formula (1) is preferably 4 to 10, both ends inclusive. By defining n as 4 or above, the adhesive tape is prevented from increasing in the elastic modulus after being cured due to too short distance of crosslinkage of epoxy resin, and thereby the adhesiveness with an object to be bonded can be improved. On the other hand, by defining n as 10 or below, the adhesive tape is prevented from lowering in the elastic modulus due to too long distance of closslinkage of epoxy resin, and thereby the connection reliability the can further be improved.

As the compounds expressed by the above formula (1) in the above, adipic acid of n=4 ($\text{HOOC}-(\text{CH}_2)_4-\text{COOH}$), sebacic acid of n=8 ($\text{HOOC}-(\text{CH}_2)_8-\text{COOH}$), and $\text{HOOC}-(\text{CH}_2)_{10}-\text{COOH}$ of n=10, for example, can be exemplified.

As the aromatic carboxylic acid, compounds having at least two phenolic hydroxyl groups within a single molecule, and having at least one carboxyl group directly bound to an aromatic ring within a single molecule can more specifically be exemplified. This sort of compound can be exemplified by, for example, benzoic acid derivatives such as 2,3-dihydroxybenzoic acid, 2,4-dihydroxybenzoic acid, gentisic acid (2,5-dihydroxybenzoic acid), 2,6-dihydroxybenzoic acid, 3,4-dihydroxybenzoic acid, gallic acid (3,4,5-trihydroxybenzoic acid), and phenolphthalin (2-[bis(p-hydroxyphenyl)methyl]benzoic acid); naphthoic acid derivatives such as 1,4-dihydroxy-2-naphthoic acid, 3,5-dihydroxy-2-naphthoic acid, and 3,7-dihydroxy-2-naphthoic acid; and diphenolic acid.

More specifically, the curing agent having a flux activity can be exemplified by the above-described sebacic acid and gentisic acid, wherein either one of, or both of them may be contained.

In the adhesive tape of the present invention, the curing agent having a flux activity may reside outside the solder powder, wherein, for example, the solder powder and the curing agent having a flux activity may independently be dispersed in the resin, or the curing agent may be adhered to the surface of the solder powder dispersed in the resin. Because the curing agent having a flux activity resides outside the solder powder, the curing agent having a flux activity can migrate, in the process of bonding, towards the interface of the solder and the conductive material in an object to be bonded in an efficient manner, and can bring the solder into direct contact with the conductive component. As a consequence, connection reliability can be improved. Because the curing agent having a flux activity resides in the resin, the curing agent can be bonded to the resin to increase in an elastic modulus or a Tg.

In view of improving flux activity, content of the curing agent having a flux activity in the adhesive tape of the present invention is adjusted typically to 0.1% by weight or more of the total content of the constituents, excluding the solder powder, of the adhesive tape, and more preferably to 1% by weight or more. In view of lowering the melt viscosity of resin in the process of bonding, the content of the curing agent having a flux activity is adjusted typically to 30% by weight or less of the total content of the constituents, excluding the solder powder, of the adhesive tape, and more preferably to 10% by weight or less.

Still more specifically, for the case where the adhesive tape of the present invention contains an epoxy resin, the content of the curing agent having a flux activity is adjusted typically to 50% by weight of the epoxy resin in the adhesive tape, and more preferably to 30% by weight or less. By the adjustment, the excessiveness of the curing agent can be resolved, and the curability can be improved.

The adhesive tape of the present invention may further contain, in the resin, another curing agent different from the curing agent having a flux activity, or may contain a resin functioning as a curing agent.

The curing agent can be exemplified by phenols, amines and thiols without special limitations, wherein phenols are preferably used when reactivity with the epoxy resin and physical properties after being cured are taken into consideration.

The phenols are not specifically limited, but those of bi-functional or larger multi-functional ones are preferable, when physical properties of the adhesive tape after being cured are taken into consideration. For example, bisphenol A, tetra methylbisphenol A, diallyl bisphenol A, biphenol, bisphenol F, diallyl bisphenol F, trisphenol, tetrakis phenol, phenol novolacs, cresol novolacs and so forth can be exemplified, wherein phenol novolacs and cresol novolacs are preferably used when the melt viscosity, reactivity with the epoxy resin and physical properties after curing are taken into consideration.

The content of curing agent other than the curing agent having a flux activity is adjusted typically to 5% by weight or more, and preferably 10% by weight or more, assuming the total content of all other constituents, but excluding the solder powder, of the adhesive tape as 100, in view of exactly allowing the resin to cure. In view of improving fluidity of the resin in the process of bonding, the content of the curing agent assuming the total content of all other constituents, but excluding the solder powder, of the adhesive tape as 100 is adjusted typically to 40% by weight or less, and preferably to 30% by weight or less.

The adhesive tape of the present invention may further contain a curing catalyst. By adopting a configuration containing the curing catalyst, the resins can more exactly be cured in the process of manufacturing the adhesive tape.

The curing agent may appropriately be selected depending on species of the resin, wherein imidazole compounds having a melting point of 150° C. or above is typically adoptable. Too low melting point of the imidazole compounds may undesirably allow the resin to cure before the solder powder migrates to the surface of the electrodes, and may destabilize the connection and may degrade storability of the adhesive tape. For this reason, imidazole preferably has a melting point of 150° C. or above. The imidazole compounds having a melting point of 150° C. or above can be exemplified by 2-phenylhydroxyimidazole, 2-phenyl-4-methylhydroxyimidazole, 2-phenyl-4,5-dihydroxyimidazole, and 2-phenyl-4-methylimidazole. The upper limit of the melting point of the imidazole compounds is not specifically limited, and may appropriately be set depending on adhesion temperature, of the adhesive tape.

Content of the curing catalyst is typically adjusted to 0.001% by weight or more, and preferably 0.01% by weight or more, assuming the total content of all other constituents, but excluding the solder powder, of the adhesive tape as 100, in view of allowing the epoxy resin to further effectively function as the curing catalyst, and thereby improving curability of the adhesive tape. The content of the curing catalyst is typically adjusted to 5% by weight or below. By this adjustment, storability of the adhesive tape can further be improved.

The adhesive tape of the present invention may further contain a silane coupling agent. By adopting a configuration containing the silane coupling agent, adhesion property of the adhesive tape to an object to be bonded can further be improved. The silane coupling agent can be exemplified by epoxy silane coupling agent, and aromatic-ring-containing aminosilane coupling agent, wherein it is good enough to contain at least either of them. A configuration containing both of them is also allowable. Content of the silane coupling agent is adjusted typically to 0.01 to 5% by weight or around, assuming the total content of all other constituents, but excluding the solder powder, of the adhesive tape as 100.

The adhesive tape of the present invention may contain components other than those described in the above. For example, various additives may appropriately be added, for the purpose of improving various characteristics including compatibility, stability, workability and so forth.

Next, a method of manufacturing the adhesive tape of the present invention will be explained. The adhesive tape can be obtained by mixing a resin, a solder powder, a curing agent having a flux activity, and any other optional additives, allowing the solder powder and the curing agent having a flux activity to disperse into the resin, applying thus-obtained dispersion onto a peelable basefilm such as a polyester sheet, and by drying the coating at a predetermined temperature.

The obtained film-form adhesive tape has the solder powder and the curing agent having a flux activity as residing in the resin layer. When the adhesive tape is placed between objects to be bonded and then heated, the solder powder in the resin layer migrates towards the surface of the conductive component in the objects to be bonded in a self-aligned manner, and thereby a metal bonding is formed.

The method of bonding using the adhesive tape of the present invention will be explained in further detail, referring to FIG. 1.

A first substrate 109, an adhesive tape 101, a second substrate 107, an adhesive tape 101 and a third substrate 105 are stacked in this order as viewed from the bottom. In this case, a first electrode (conductive component) 113 provided to the surface of the first substrate 109 and a second electrode (conductive component) 115 provided to the surface of the second substrate 107 are opposed to each other. Also a second electrode (conductive component) 121 provided on the surface of the second substrate 107 and a third electrode (conductive component) 119 provided to the surface of the third substrate 105 are opposed to each other.

In the second substrate 107, a via may be filled with a predetermined material, or may be a through-hole.

The stack is then bonded under heating at a predetermined temperature. By this procedure, a connected structure is formed. Bonding temperature may be set depending on species of the solder powder 103 and species of the resin contained in the adhesive tape 101.

The bonding temperature is defined as a temperature higher than the fusing temperature of the solder powder 103, and capable of keeping the resin layer 132 melted. From this point of view, the bonding temperature is typically set higher than 100° C., and preferably to 120° C. or above. From the point of view that the resin preferably shows low melt viscosity at the bonding temperature, the bonding temperature is adjusted typically to 250° C. or below, and preferably 200° C. or below. The bonding temperature is preferably low, also in view of expanding a region ensuring low melt viscosity of the resin.

In view of allowing the solder powder 103 to migrate as being flowed towards the surface of the electrodes in a more efficient manner, the stack is preferably pressed under a predetermined pressure in the process of bonding. In view of further exactly forming solder regions 111, the pressing pressure is typically adjusted to 0 MPa or above, and preferably 1 MPa or above. It is also allowable that the adhesive tape is simply applied with a predetermined pressure ascribable to the self-weight of the members placed on the adhesive tape, even if pressure intentionally applied to the adhesive tape is 0 MPa. In view of further improving connection reliability, the pressure is adjusted typically to 20 MPa or less, and preferably 10 MPa or less.

The resin layer 132 in the adhesive tape 101 melts under heating. Also the solder powder 103 in the adhesive tape 101 melts. The molten solder powder 103 migrates from the resin layer 132 towards the electrodes provided to the surface of each substrate in a self-aligned manner. Because the solder powder 103 is self-aligned to the regions where the electrodes are opposed, and thereby the solder regions 111 are formed respectively between the first electrode 113 and the second electrode 115, and between the second electrode 121 and the third electrode 119.

Also the curing agent having a flux activity (not shown) which resides in the resin migrates towards the interface between the solder powder 103 and the electrodes in an efficient manner, and at the same time removes an oxidized film on the surface of the solder powder 103, so that the solder regions 111 and the individual electrodes are directly bonded through metals, and thereby electrically connected. By cooling the stack thereafter, after the resin in the adhesive tape cured, a state of bonding between the electrodes via the solder regions 111 is maintained.

As described in the above, use of the tape-form adhesive tape 101 simply needs heating for bonding at a single predetermined temperature, and can readily bond the substrates. The heating for bonding is, however, not limited to heating at a single temperature, typically allowing stepped curing involving heating at 150° C. for 100 seconds and succeeding heating at 200° C. for 100 seconds, or involving heat compression at 180° C. for 10 seconds and post-curing in an oven at 200° C. for 10 minutes. Because the electrodes and the solder contained in the adhesive tape 101 are bonded through metal bonding with the aid of the solder particles composing the solder powder 103, the contact resistance is kept low, and the connection reliability is kept high.

In thus-formed connected structure, it is preferable that 50% or more of the carboxyl group of the curing agent having a flux activity contained in the adhesive tape 101 is reacted with the thermosetting resin.

In particular, it is preferable that 70% or more of the carboxyl group of the curing agent having a flux activity contained in the adhesive tape 101 is reacted with the thermosetting resin.

By making 50% or more, and preferably 70% or more of the carboxyl group of the curing agent having a flux activity contained in the adhesive tape reacted with thermosetting resin, the conductive components are prevented from corroding even when the connected structure is stored at high temperatures.

Ratio of reaction can be measured as described below.

An adhesive tape cured at 180° C. for 10 minutes in a nitrogen-substituted oven and an uncured adhesive tape are subjected to IR measurement.

The degree of curing is calculated from the equation below, assuming intensity of peak which appears before curing at around 1600 cm$^{-1}$ ascribable to the carboxyl group as (A), and intensity of peak which appears after curing as (B):

Degree of curing (%)={1−(B)/(A)}×100.

The adhesive tape of the present invention is configured as being excellent in adhesiveness with an object to be bonded, and also as being excellent in reliability of electrical connection between the conductive components. For example, the adhesive tape of the present invention may be applied to electronics so as to bond electronic or electric components with each other, and to thereby electrically connect them with each other. The electronics can be exemplified typically by computer, television, mobile phone, game machine, various communication instruments and measurement instruments.

The adhesive tape of the present invention allows exact bonding even when the conductive components in an object to be bonded has only a small area for bonding, and can preferably be adopted to bonding substrates, chips and so forth typically in semiconductor package.

For example, the adhesive tape of the present invention is used for bonding substrates with each other in semiconductor package.

The semiconductor package having the adhesive tape applied thereto is typically configured as stacking a first substrate, an adhesive tape and a second substrate in this order, wherein a first electrode provided to the first substrate and a second electrode provided to the second substrate are connected through the solder regions in the adhesive tape.

The adhesive tape has, in the state thereof after bonding, the resin and the solder regions formed as penetrating the resin. It is both allowable that the curing agent having a flux activity remains in the resin, or does not remain in the resin.

As will be described later in Example, the solder regions has a shape expanding from inside of the adhesive tape towards the first electrode and the second electrode. Because the solder regions are increased in diameter on both surfaces of the adhesive tape, the configuration is consequently excellent in adhesiveness between the solder regions and the resin in the adhesive tape, and ensures large contact area of the first and the second electrode with the solder regions.

When the adhesive tape of the present invention is used in bonding of the substrates, it is both allowable that the first and the second substrates have a solder resist provided thereto, or have no solder resist provided thereto.

Figure 2:
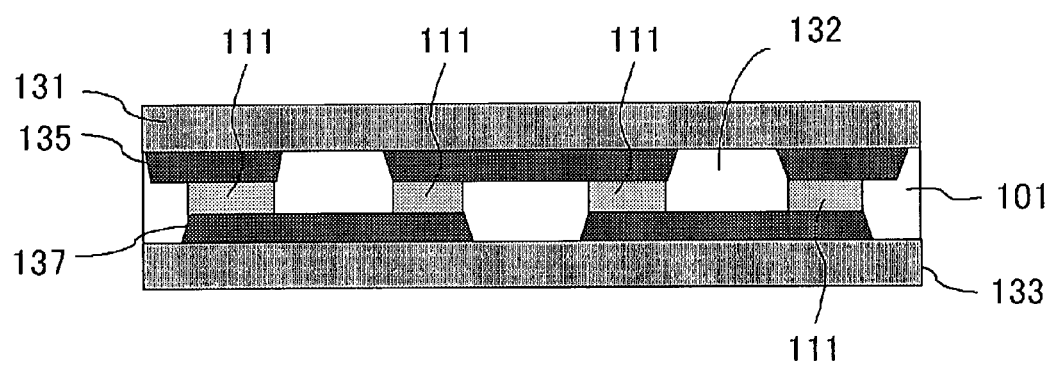
FIG. 2 is a sectional view explaining a method of bonding using the adhesive tape according to an embodiment.

FIG. 2 is a sectional view explaining a method of bonding the substrates having no solder resist provided thereto.

As seen in FIG. 2, on a first base 133 and a second base 131, there are provided a first electrode (conductive component) 137 and a second electrode (conductive component) 135, respectively. By placing the adhesive tape 101 of the present invention between the substrates, and by heating them at a predetermined temperature, the resin layer 132 can bond the substrates with each other, and can, at the same time, allow the solder powder to migrate towards to the surface of the first electrode 137 and the second electrode 135 to a self-aligned manner, to thereby connects the electrodes through the solder regions 111.

Figure 3:
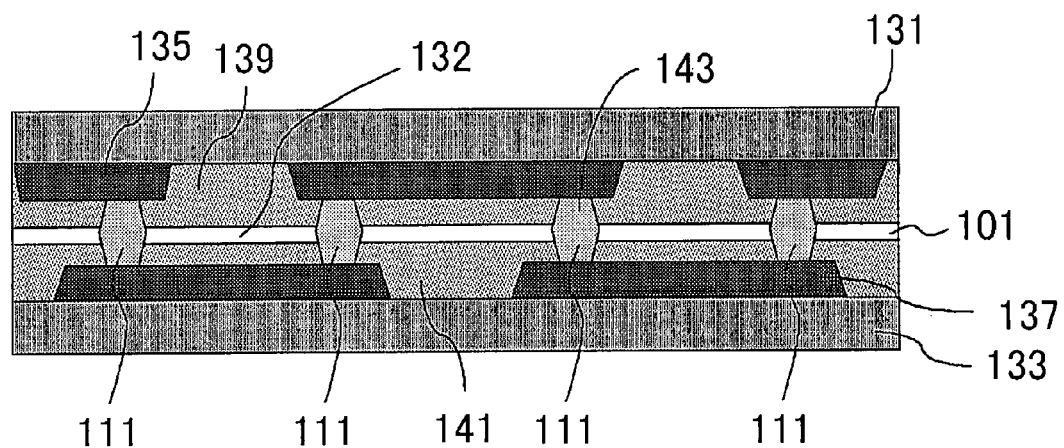
FIG. 3 is a sectional view explaining a method of bonding using the adhesive tape according to an embodiment.

FIG. 3 is a sectional view explaining a method of bonding the substrates having a solder resist provided thereto. A basic configuration shown in FIG. 3 is similar to that in FIG. 2, but differs in that the first base 133 and the second base 131 have a first solder resist layer 141 and a second solder resist layer 139, respectively, provided thereto, and that the first electrode 137 and the second electrode 135 are buried in the first solder resist layer 141 and the second solder resist layer 139, respectively. At predetermined positions in the region where the first electrode 137 and the second electrode 135 are opposed, there are provided spaces 143 so as to penetrate the first solder resist layer 141 and the second solder resist layer 139.

Also in the process of bonding of such bases, the adhesive tape 101 of the present invention is placed between the substrates, and heated at a predetermined temperature. By this procedure, the solder powder migrates, in a self-aligned manner, towards the surfaces of the first electrode 137 and the second electrode 135 exposed out from the spaces 143, and fills the spaces 143. The interconnects are thus connected through the solder regions 111.

The adhesive tape of the present invention may be used for bonding between semiconductor chips in a semiconductor package.

Figure 4:
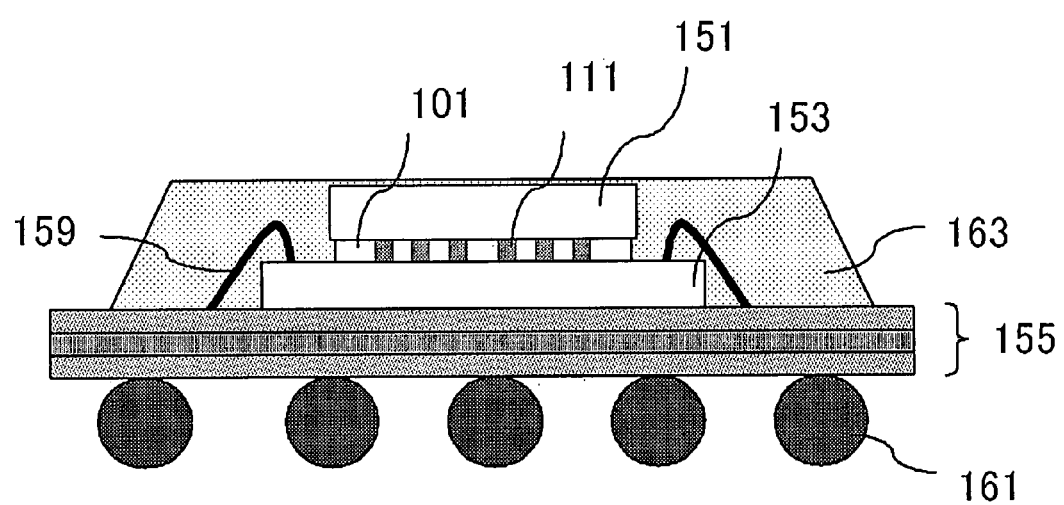
FIG. 4 is a sectional view showing a configuration of the semiconductor package according to an embodiment.
Figure 5:
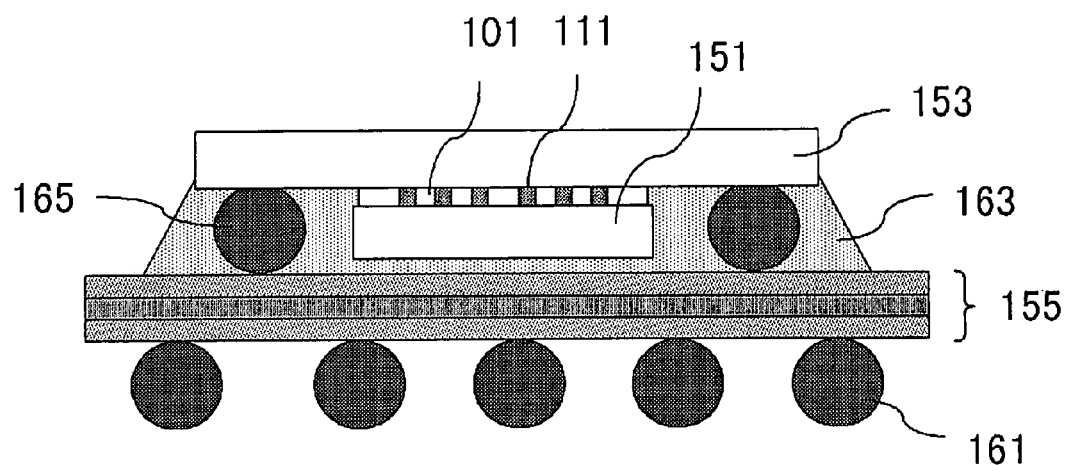
FIG. 5 is a sectional view showing a configuration of the semiconductor package according to an embodiment.

FIG. 4 and FIG. 5 are sectional views showing configurations of semiconductor packages (connected structures) having semiconductor chips bonded therein via the adhesive tape.

In FIG. 4, a second semiconductor chip 153, the adhesive tape 101 and a first semiconductor chip 151 are stacked in this order, wherein electrodes (not shown) as the conductive components of the second semiconductor chip 153 and electrodes (not shown) as the conductive components of the first semiconductor chip 151 are connected through the solder regions 111 in the adhesive tape 101. Electrodes provided on the back surface of the second semiconductor chip 153 and electrodes of a chip mounting substrate (mounting substrate 155) are connected through wires 159. The first semiconductor chip 151, the second semiconductor chip 153 and the wires 159 are encapsulated by a molding resin 163. On the back surface of the mounting substrate 155, there are provided a plurality of bump electrodes 161.

A basic configuration shown in FIG. 5 is similar to that shown in FIG. 4, wherein in FIG. 5, the second semiconductor chip 153 is connected by flip-chip bonding through the bump electrodes 165 to the mounting substrate 155, wherein the first semiconductor chip 151 is disposed between the mounting substrate 155 and the second semiconductor chip 153.

In FIG. 4 and FIG. 5, the first semiconductor chip 151 and the second semiconductor chip 153 are bonded using the adhesive tape 101 of the present invention. Thickness of the package can, therefore, be reduced as compared with the case where the chips are bonded through bump electrodes. By using the adhesive tape 101, the chips can be bonded by a simple process, and the electrodes of the chips can be connected in a highly reliable and stable manner.

It is still also allowable to use the adhesive tape of the present invention for bonding of the substrates, when the mounting substrate of the semiconductor package is mounted on still another substrate. For example, it is adoptable for secondary mounting of the semiconductor package onto a PC board or the like.

Figure 6:
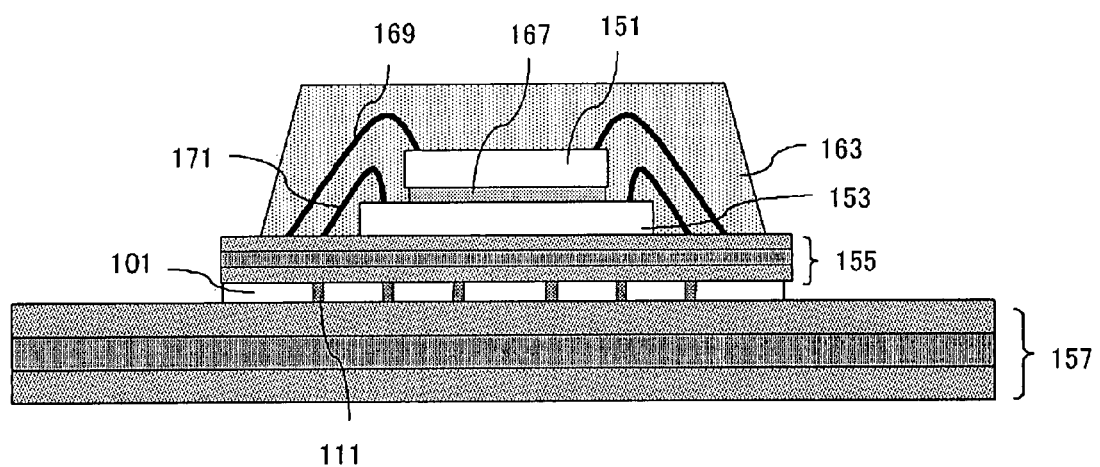
FIG. 6 is a sectional view showing a configuration of the semiconductor package according to an embodiment.

FIG. 6 is a sectional view showing a configuration of this sort of semiconductor package. In FIG. 6, a first substrate (mounting substrate 155) having semiconductor chips (the first semiconductor chip 151 and the second semiconductor chip 153) mounted thereon, and a second substrate (substrate 157) having mounting substrate 155 mounted thereon, are bonded through the adhesive tape 101. The substrate 157 may typically be a PC board. A resin 167 is filled between the first semiconductor chip 151 and the second semiconductor chip 153. Electrodes (not shown) provided to the first semiconductor chip 151 and the second semiconductor chip 153 are respectively connected through wires 169 and wires 171, respectively, to electrodes (not shown) on the mounting substrate 155.

Because the mounting substrate 155 and the substrate 157 shown in FIG. 6 are bonded through the adhesive tape 101, the electrodes provided to the substrates can be bonded in a highly reliable and stable manner. Use of the adhesive tape 101 can also reduce the distance between the substrates, and can thereby thin the package as a whole.

Embodiments of the present invention, having been described in the above referring to the attached drawings, are merely for exemplary purposes, allowing adoption of any various configurations other than those described in the above.

EXAMPLES (Manufacture of Adhesive Tape)

Adhesive tapes of 40-μm-thickness, containing a resin, a solder powder, and a curing agent having a flux activity were manufactured (Examples 1 to 18). As Comparative Examples, also adhesive tapes of 40-μm-thick containing a resin, a solder powder, and curing agent having a flux activity were manufactured (Comparative Examples 1 to 4).

Ratios of blending of the individual components are shown in Table 1 to Table 4 and Table 13, as being expressed in parts by weight. In each Example and each Comparative Example, the individual components were dissolved, based on the ratio of blending shown in Table 1 to Table 4 and Table 13, into an aromatic hydrocarbon-base solvent such as toluene and xylene, an ester-base organic solvent such as ethyl acetate and butyl acetate, or a ketone-base organic solvent such as acetone and methyl ethyl ketone, the obtained varnish was then coated on a polyester sheet, and dried at a temperature allowing the above-described organic solvent to vaporize.

TABLE 1

| | Function | Component | Structure, etc. | Example 1 | Example 2 | Example 3 | Example 4 | Example 5 |
|---|---|---|---|---|---|---|---|---|
| Composition | Addition of film forming property Reduction in elastic modulus | Acrylic rubber | (Butyl acrylate)-(ethyl acrylate)-(acrylonitrile) = 30 mol %/30 mol %/40 mol %, morecular weight = 850,000 | 25.9 | 25.9 | 25.9 | 25.9 | 25.9 |
| | | Polyvinyl butyral resin | Degree of Polymerization = 1700, degree of acetylation = 3 mol % or less, degree of butyralation = 65 mol % or more, flow softening point = 225° C. | | | | | |
| | | Phenoxy resin | Bisphenol A backbone, number average molecular weight = 30,000 | | | | | |
| | Curing component 1 | Epoxy resin | Structural name given as *1 below | 24.5 | 24.5 | 24.5 | 24.5 | 24.5 |
| | Curing component 2 | Epoxy resin | Cresol novolac-type epoxy resin, softening point = 80° C. | 16.3 | 19.3 | 6.3 | 16.3 | 16.3 |
| | Curing component 3 | Epoxy resin | Liquid bis-F-type epoxy, epoxy equivalent = 170 | 7.5 | 7.5 | 7.5 | 7.5 | 7.5 |
| | Curing agent | Phenol novolac | Softening point = 100° C., OH equivalent = 104 | 20.2 | 20.2 | 20.2 | 20.2 | 20.2 |
| | Addition of adhesiveness 1 | Silane coupling agent | 3-Glycidoxypropyl trimethoxysilane | 0.1 | 0.1 | 0.1 | 0.1 | 0.1 |
| | Addition of adhesiveness 2 | Silane coupling agent | N-phenyl-3-aminopropyl trimethoxysilane | 0.35 | 0.35 | 0.35 | 0.35 | 0.35 |
| | Curing catalyst | Imidazole Imidazole | 2-phenyl-4,5-dihydroxyimidazole 2-phenyl-4-methylimidazole | 0.15 | 0.15 | 0.15 | 0.15 | 0.15 |
| | Curing agent having flux activity | Sebacic acid | HOOC—(CH$_2$)$_8$—COOH | 5.0 | 2.0 | 15.0 | | |
| | | Adipic acid | HOOC—(CH$_2$)$_4$—COOH | | | | | 5.0 |
| | | Gentisic acid | HOOC—(CH$_2$)$_{10}$—COOH 2,5-Dihydroxybenzoic acid | | | | 5.0 | |
| | | | Totel resin | 100.0 | 100.0 | 100.0 | 100.0 | 100.0 |

TABLE 1-continued

| Function | Component | Structure, etc. | Example 1 | Example 2 | Example 3 | Example 4 | Example 5 |
|---|---|---|---|---|---|---|---|
| Conductive particle | Solder powder | Sn/Bi = 42/58, melting point = 138° C., mean particle size = 35 μm | 60 | 60 | 60 | 60 | 60 |
| | | Sn/Bi = 42/58, melting point = 138° C., mean particle size = 20 μm | | | | | |
| | | Sn/Bi = 42/58, melting point = 138° C., mean particle size = 12 μm | | | | | |
| | | Sn/In = 48/52, melting point = 118° C., mean particle size = 35 μm | | | | | |

*1 mixture of 2-[4-(2,3-epoxypropoxy)phenyl]-2[4[1,1-bis [4-(2,3-epoxypropoxy)phenyl]ethyl]phenyl]propane and 1,3-bis[4-[1-[4-(2,3-epoxypropoxy)phenyl]-1-[4-[1-[4-(2,3-epoxypropoxy)phenyl]-1-methylethyl]phenyl]phenoxy]2-propanol

TABLE 2

| | Function | Component | Structure, etc. | Example 6 | Example 7 | Example 8 | Example 9 | Example 10 |
|---|---|---|---|---|---|---|---|---|
| Composition | Addition of film forming property Reduction in elastic modulus | Acrylic rubber | (Butyl acrylate)-(ethyl acrylate)-(acrylonitrile) = 30 mol %/30 mol %/40 mol %, molecular weight = 850,000 | 25.9 | 25.9 | 25.9 | 25.9 | 25.9 |
| | | Polyvinyl butyral resin | Degree of Polymerization = 1700, degree of acetylation = 3 mol % or less, degree of butyralation = 65 mol % or more, flow softening point = 225° C. | | | | | |
| | | Phenoxy resin | Bisphenol A backbone, number average molecular weight = 30,000 | | | | | |
| | Curing component 1 | Epoxy resin | Structural name given as *1 below | 24.5 | 24.5 | 24.5 | 24.5 | 24.5 |
| | Curing component 2 | Epoxy resin | Cresol novolac-type epoxy resin, softening point = 80° C. | 16.3 | 16.3 | 16.3 | 16.3 | 16.3 |
| | Curing component 3 | Epoxy resin | Liquid bis-F-type epoxy, epoxy equivalent = 170 | 7.5 | 7.5 | 7.5 | 7.5 | 7.5 |
| | Curing agent | Phenol novolac | Softening point = 100° C., OH equivalent = 104 | 20.2 | 20.2 | 20.2 | 20.2 | 20.2 |
| | Addition of adhesiveness 1 | Silane coupling agent | 3-Glycidoxypropyl trimethoxysilane | 0.1 | 0.1 | 0.1 | 0.1 | 0.1 |
| | Addition of adhesiveness 2 | Silane coupling agent | N-phenyl-3-aminopropyl trimethoxysilane | 0.35 | 0.35 | 0.35 | 0.35 | 0.35 |
| | Curing catalyst | Imidazole | 2-phenyl-4,5-dihydroxyimidazole | 0.15 | | 0.15 | 0.15 | 0.15 |
| | | Imidazole | 2-phenyl-4-methylimidazole | | 0.15 | | | |
| | Curing agent having flux activity | Sebacic acid | HOOC—(CH$_2$)$_8$—COOH | | 5.0 | 5.0 | 5.0 | 5.0 |
| | | Adipic acid | HOOC—(CH$_2$)$_4$—COOH | | | | | |
| | | | HOOC—(CH$_2$)$_{10}$—COOH | 5.0 | | | | |
| | | Gentisic acid | 2,5-Dihydroxybenzoic acid | | | | | |
| | | | Total resin | 100.0 | 100.0 | 100.0 | 100.0 | 100.0 |
| Conductive particle | | Solder powder | Sn/Bi = 42/58, melting point = 138° C., mean particle size = 35 μm | 60 | 60 | | | |
| | | | Sn/Bi = 42/58, melting point = 138° C., mean particle size = 20 μm | | | | 60 | |
| | | | Sn/Bi = 42/58, melting point = 138° C., mean particle size = 12 μm | | | | | 60 |

TABLE 2-continued

| Function | Component | Structure, etc. | Example 6 | Example 7 | Example 8 | Example 9 | Example 10 |
|---|---|---|---|---|---|---|---|
| | | Sn/In = 48/52, melting point = 118° C., mean particle size = 35 μm | | | | | 60 |

*1 mixture of 2-[4-(2,3-epoxypropoxy)phenyl]-2[4[1,1-bis [4-(2,3-epoxypropoxy)phenyl]ethyl]phenyl]propane and 1,3-bis[4-[1-[4-(2,3-epoxypropoxy)phenyl]-1-[4-[1-[4-(2,3-epoxypropoxy)phenyl]-1-methyl]ethyl]phenyl]phenoxy]2-propanol

TABLE 3

| | Function | Component | Structure, etc. | Example 11 | Example 12 | Example 13 | Example 14 |
|---|---|---|---|---|---|---|---|
| Composition | Addition of film forming property Reduction in elastic modulus | Acrylic rubber | (Butyl acrylate)-(ethyl acrylate)-(acrylonitrile) = 30 mol %/30 mol %/40 mol %, molecular weight = 850,000 | | | 15.0 | 45.0 |
| | | Polyvinyl butyral resin | Degree of Polymerization = 1700, degree of acetylation = 3 mol % or less, degree of butyralation = 65 mol % or more, flow softening point = 225° C. | 25.9 | | | |
| | | Phenoxy resin | Bisphenol A backbone, number average molecular weight = 30,000 | | 25.9 | | |
| | Curing component 1 | Epoxy resin | Structural name given as *1 below | 24.5 | 24.5 | 30.0 | 12.0 |
| | Curing component 2 | Epoxy resin | Cresol novolac-type epoxy resin, softening point = 80° C. | 16.3 | 16.3 | 16.3 | 16.3 |
| | Curing component 3 | Epoxy resin | Liquid bis-F-type epoxy, epoxy equivalent = 170 | 7.5 | 7.5 | 7.5 | 7.5 |
| | Curing agent | Phenol novolac | Softening point = 100° C., OH equivalent = 104 | 20.2 | 20.2 | 25.6 | 13.6 |
| | Addition of adhesiveness 1 | Silane coupling agent | 3-Glycidoxypropyl trimethoxysilane | 0.1 | 0.1 | 0.1 | 0.1 |
| | Addition of adhesiveness 2 | Silane coupling agent | N-phenyl-3-aminopropyl trimethoxysilane | 0.35 | 0.35 | 0.35 | 0.35 |
| | Curing catalyst | Imidazole | 2-phenyl-4,5-dihydroxyimidazole | 0.15 | 0.15 | 0.15 | 0.15 |
| | | Imidazole | 2-phenyl-4-methylimidazole | | | | |
| | Curing agent having flux activity | Sebacic acid | HOOC—$(CH_2)_8$—COOH | 5.0 | 5.0 | 5.0 | 5.0 |
| | | Adipic acid | HOOC—$(CH_2)_4$—COOH | | | | |
| | | | HOOC—$(CH_2)_{10}$—COOH | | | | |
| | | Gentisic acid | 2,5-Dihydroxybenzoic acid | | | | |
| | | | Total resin | 100.0 | 100.0 | 100.0 | 100.0 |
| | Conductive particle | Solder powder | Sn/Bi = 42/58, melting point = 138° C., mean particle size = 35 μm | 60 | 60 | 60 | 60 |
| | | | Sn/Bi = 42/58, melting point = 138° C., mean particle size = 20 μm | | | | |
| | | | Sn/Bi = 42/58, melting point = 138° C., mean particle size = 12 μm | | | | |
| | | | Sn/In = 48/52, melting point = 118° C., mean particle size = 35 μm | | | | |

*1 mixture of 2-[4-(2,3-epoxypropoxy)phenyl]-2[4[1,1-bis [4-(2,3-epoxypropoxy)phenyl]ethyl]phenyl]propane and 1,3-bis[4-[1-[4-(2,3-epoxypropoxy)phenyl]-1-[4-[1-[4-(2,3-epoxypropoxy)phenyl]-1-methyl]ethyl]phenyl]phenoxy]2-propanol

TABLE 4

| | Function | Component | Structure, etc. | Comparative Example 1 | Comparative Example 2 | Comparative Example 3 | Comparative Example 4 |
|---|---|---|---|---|---|---|---|
| Composition | Addition of film forming property Reduction in elastic modulus | Acrylic rubber | (Butyl acrylate)-(ethyl acrylate)-(acrylonitrile) = 30 mol %/30 mol %/40 mol %, molecular weight = 850,000 | 25.9 | 5.0 | 70.0 | 70.0 |
| | | Polyvinyl butyral resin | Degree of Polymerization = 1700, degree of acetylation = 3 mol % or less, degree of butyralation = 65 mol % or more, flow softening point = 225° C. | | | | |
| | | Phenoxy resin | Bisphenol A backbone, number average molecular weight = 30,000 | | | | |
| | Curing component 1 | Epoxy resin | Structural name given as *1 below | 24.5 | 35.4 | | |
| | Curing component 2 | Epoxy resin | Cresol novolac-type epoxy resin, softening point = 80° C. | 16.3 | 16.3 | 10.0 | 10.0 |
| | Curing component 3 | Epoxy resin | Liquid bis-F-type epoxy, epoxy equivalent = 170 | 7.5 | 7.5 | 7.5 | 7.5 |
| | Curing agent | Phenol novolac | Softening point = 100° C., OH equivalent = 104 | | 30.2 | 6.9 | |
| | Addition of adhesiveness 1 | Silane coupling agent | 3-Glycidoxypropyl trimethoxysilane | 0.1 | 0.1 | 0.1 | 0.1 |
| | Addition of adhesiveness 2 | Silane coupling agent | N-phenyl-3-aminopropyl trimethoxysilane | 0.35 | 0.35 | 0.35 | 0.35 |
| | Curing catalyst | Imidazole | 2-phenyl-4,5-dihydroxyimidazole | | 0.15 | 0.15 | |
| | | Imidazole | 2-phenyl-4-methylimidazole | | | | |
| | | Latent curing agent | Novacure HX-3941HP *2 | 20.4 | | | 7.1 |
| | Curing agent having flux activity | Sebacic acid | HOOC—$(CH_2)_8$—COOH | 5.0 | 5.0 | 5.0 | 5.0 |
| | | Adipic acid | HOOC—$(CH_2)_4$—COOH | | | | |
| | | | HOOC—$(CH_2)_{10}$—COOH | | | | |
| | | Gentisic acid | 2,5-Dihydroxybenzoic acid | | | | |
| | | | Total resin | 100.05 | 100.05 | 100.05 | 100.0 |
| Conductive particle | | Solder powder | Sn/Bi = 42/58, melting point = 138° C., mean particle size = 35 μm | 60 | 60 | 60 | 60 |
| | | | Sn/Bi = 42/58, melting point = 138° C., mean particle size = 20 μm | | | | |
| | | | Sn/Bi = 42/58, melting point = 138° C., mean particle size = 12 μm | | | | |
| | | | Sn/In = 48/52, melting point = 118° C., mean particle size = 35 μm | | | | |

*1 mixture of 2-[4-(2,3-epoxypropoxy)phenyl]-2[4[1,1-bis [4-(2,3-epoxypropoxy)phenyl]ethyl]phenyl]propane and 1,3-bis[4-[1-[4-(2,3-epoxypropoxy)phenyl]-1-[4-[1-[4-(2,3-epoxypropoxy)phenyl]-1-methyl]ethyl]phenyl]phenoxy]2-propanol
*2 Imidazole-base latent curing agent, from Asahi Kasei Chemicals Curing temperature $T_1$ of the resin layer, melting point $T_2$ of the solder powder, and melt viscosity of the resin layer at the melting point $T_2$ of the solder powder in the individual Examples and Comparative Examples were shown in Tables 5 to 8, and Table 14.

TABLE 5

|  | Example 1 | Example 2 | Example 3 | Example 4 | Example 5 |
|---|---|---|---|---|---|
| Curing temperature ($T_1$) of resin layer | 196 | 202 | 189 | 204 | 200 |
| Melting point ($T_2$) of solder powder | 138 | 138 | 138 | 138 | 138 |
| Melt viscosity of resin layer | 430 | 350 | 660 | 450 | 490 |
| $T_1 - T_2$ | 58 | 64 | 51 | 66 | 62 |

TABLE 6

|  | Example 6 | Example 7 | Example 8 | Example 9 | Example 10 |
|---|---|---|---|---|---|
| Curing temperature ($T_1$) of resin layer | 206 | 186 | 196 | 196 | 196 |
| Melting point ($T_2$) of solder powder | 138 | 138 | 138 | 138 | 118 |
| Melt viscosity of resin layer | 550 | 740 | 810 | 1110 | 520 |
| $T_1 - T_2$ | 68 | 48 | 58 | 58 | 78 |

TABLE 7

|  | Example 11 | Example 12 | Example 13 | Example 14 |
|---|---|---|---|---|
| Curing temperature ($T_1$) of resin layer | 197 | 196 | 194 | 198 |
| Melting point ($T_2$) of solder powder | 138 | 138 | 138 | 138 |
| Melt viscosity of resin layer | 270 | 150 | 110 | 3870 |
| $T_1 - T_2$ | 59 | 58 | 56 | 60 |

TABLE 8

|  | Comparative Example 1 | Comparative Example 2 | Comparative Example 3 | Comparative Example 4 |
|---|---|---|---|---|
| Curing temperature ($T_1$) of resin layer | 132 | 192 | 204 | 144 |
| Melting point ($T_2$) of solder powder | 138 | 138 | 138 | 138 |
| Melt viscosity of resin layer | 1340 | 34 | 6580 | 7630 |
| $T_1 - T_2$ | −6 | 54 | 66 | 6 |

The adhesive tapes having good film forming properties were obtained in Examples 1 to 18.

(Evaluation of Bonding Between Substrates)

The substrates were bonded as shown in FIG. 2, using each of the adhesive tapes obtained in Examples 1 to 18 and Comparative Examples 1 to 4, without using a solder resist. The substrates used herein were FR-4 of 0.4 mm thick, having a Ni/Au plated copper foil (first electrode, second electrode) of 12 μm thick, a width/space of circuit of 300 μm/100 μm, and a width of overlapping of the upper and lower circuits of 100 μm, wherein each adhesive tape was placed between the substrates, a 200-μm-thick silicon rubber was placed on the upper surface of the substrate so that pressure can uniformly be applied, and bonded by heat compression bonding at 220° C. under 2 MPa for 600 seconds.

The substrates provided a solder resist thereon were also bonded as shown in FIG. 3, using each of the adhesive tapes obtained in Examples 1 to 18 and Comparative Examples 1 to 4. The substrates used herein were FR-4 of 0.4 mm thick, having a copper foil (first electrode, second electrode) of 12 μm thick and Ni/Au plating, a solder resist of 12 μm thick (thickness measured from the top surface of the circuits (first electrode, second electrode)), a width/space of circuit of 300 μm/100 μm, and a width of overlapping of the upper and lower circuits of 100 μm, wherein each adhesive tape was placed between the substrates, a 200-μm-thick silicon rubber was placed on the upper surface of the substrate so that pressure can uniformly be applied, and bonded by heat compression bonding at 220° C. under 2 MPa for 600 seconds.

Contact resistance values of the adjacent terminals of thus obtained connected structures was measured at 12 points by the four-terminal method, and the average of these values were adopted as a measured value. In Table 9 to Table 12 and Table 15, the measured values of 30 mΩ or smaller were judged as "○", and those of 30 mΩ or larger were judged as "×".

Ratio of reaction of carboxyl group(s) of the curing agent having a flux activity in each of the adhesive tapes to thermosetting resin was measured. Method of measuring the ratio of reaction is similar to as described in the above embodiments.

Figure 7:
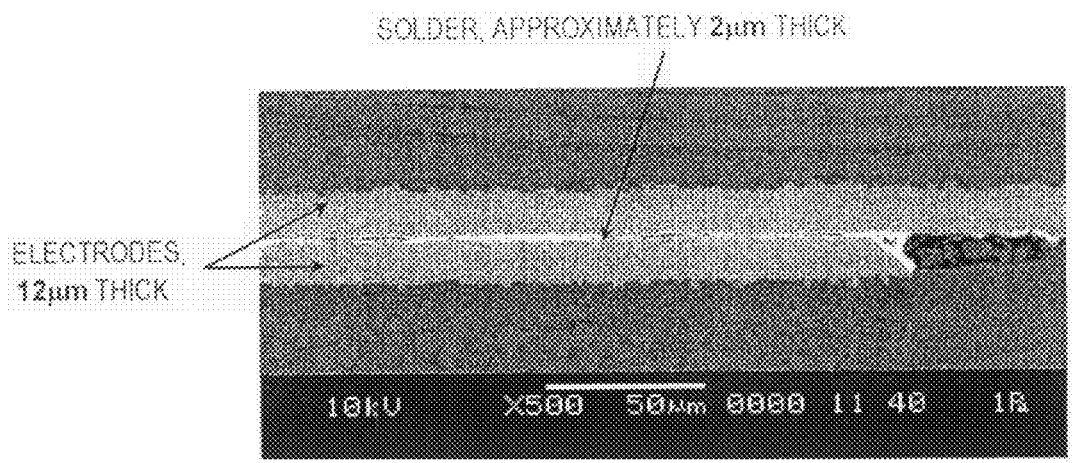
FIG. 7 is a sectional view showing a configuration of a stack according to an embodiment.
Figure 8:
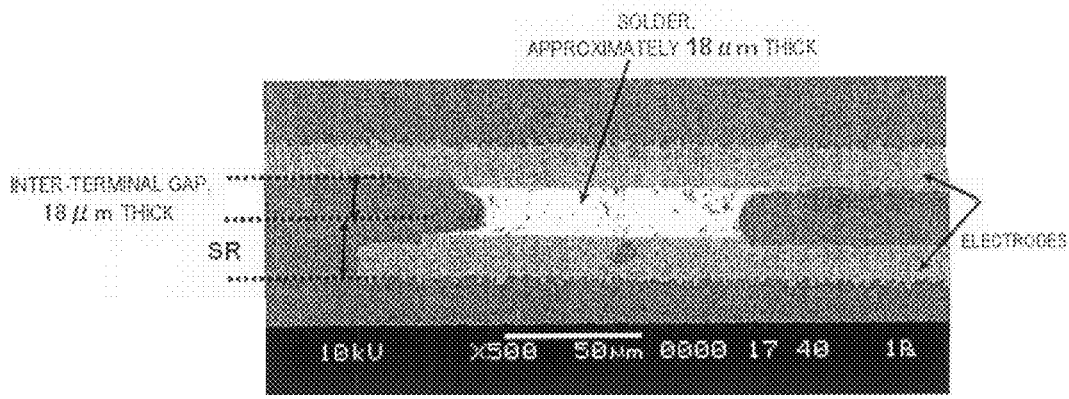
FIG. 8 is a sectional view showing a configuration of a stack according to an embodiment.

Sections of 10 terminals of each of Examples and Comparative Examples were observed, and those showing solder conductive columns formed in all of the observed points as shown in FIG. 7 and FIG. 8 were expressed as "○", and those showing absence of the conductive columns even at a single point were judged as "×".

FIG. 7 herein is a sectional view showing the stack in Example 1, having no solder resist, observed under a scanning electron microscope (SEM). As shown in FIG. 7, the thickness of solder was found to be 2 μm, demonstrating a good solder bondability.

FIG. 8 is a sectional view showing the stack in Example 1, having the solder resist, observed under a SEM. As shown in FIG. 8, the gap between the terminals was found to be approximately 18 μm. The thickness of solder was found to be 18 μm, demonstrating a good solder bondability. The solder region connecting the electrodes was found to have a geometry such as being enlarged in diameter toward both electrodes.

TABLE 9

| | | | | Example 1 | Example 2 | Example 3 | Example 4 | Example 5 |
|---|---|---|---|---|---|---|---|---|
| Results of Evaluation | Contact resistance value between adjacent terminals | Substrate having no solder resist | Measured value(mΩ) | 14 | 20 | 14 | 20 | 16 |
| | | | Judgment | ○ | ○ | ○ | ○ | ○ |
| | | Substrate having solder resist | Measured value(mΩ) | 15 | 19 | 16 | 25 | 15 |
| | | | Judgment | ○ | ○ | ○ | ○ | ○ |
| | Formability of conductive column between adjacent terminals | Substrate having no solder resist | Judgment | ○ | ○ | ○ | ○ | ○ |
| | | Substrate having solder resist | Judgment | ○ | ○ | ○ | ○ | ○ |
| | Ratio of reaction of carboxyl group(s) of curing agent | | | 83 | 96 | 71 | 69 | 76 |

TABLE 10

| | | | | Example 6 | Example 7 | Example 8 | Example 9 | Example 10 |
|---|---|---|---|---|---|---|---|---|
| Results of Evaluation | Contact resistance value between adjacent terminals | Substrate having no solder resist | Measured value(mΩ) | 15 | 24 | 22 | 27 | 18 |
| | | | Judgment | ○ | ○ | ○ | ○ | ○ |
| | | Substrate having solder resist | Measured value(mΩ) | 17 | 22 | 23 | 26 | 17 |
| | | | Judgment | ○ | ○ | ○ | ○ | ○ |
| | Formability of conductive column between adjacent terminals | Substrate having no solder resist | Judgment | ○ | ○ | ○ | ○ | ○ |
| | | Substrate having solder resist | Judgment | ○ | ○ | ○ | ○ | ○ |
| | Ratio of reaction of carboxyl group(s) of curing agent | | | 67 | 88 | 82 | 84 | 85 |

TABLE 11

| | | | | Example 11 | Example 12 | Example 13 | Example 14 |
|---|---|---|---|---|---|---|---|
| Results of Evaluation | Contact resistance value between adjacent terminals | Substrate having no solder resist | Measured value(mΩ) | 25 | 24 | 15 | 24 |
| | | | Judgment | ○ | ○ | ○ | ○ |
| | | Substrate having solder resist | Measured value(mΩ) | 24 | 22 | 14 | 23 |
| | | | Judgment | ○ | ○ | ○ | ○ |
| | Formability of conductive column between adjacent terminals | Substrate having no solder resist | Judgment | ○ | ○ | ○ | ○ |
| | | Substrate having solder resist | Judgment | ○ | ○ | ○ | ○ |
| | Ratio of reaction of carboxyl group(s) of curing agent | | | 86 | 87 | 79 | 89 |

TABLE 12

|  |  |  |  | Comparative Example 1 | Comparative Example 2 | Comparative Example 3 | Comparative Example 4 |
|---|---|---|---|---|---|---|---|
| Results of Evaluation | Contact resistance value between adjacent terminals | Substrate having no solder resist | Measured value(mΩ) | open | open | open | open |
|  |  |  | Judgment | X | X | X | X |
|  |  | Substrate having solder resist | Measured value(mΩ) | open | open | open | open |
|  |  |  | Judgment | X | X | X | X |
|  | Formability of conductive column between adjacent terminals | Substrate having no solder resist | Judgment | X | X | X | X |
|  |  | Substrate having solder resist | Judgment | X | X | X | X |
|  | Ratio of reaction of carboxyl group(s) of curing agent |  |  | — | 78 | 95 | — |

TABLE 13

|  | Function | Component | Structure, etc. | Example 15 | Example 16 | Example 17 | Example 18 |
|---|---|---|---|---|---|---|---|
| Composition | Addition of film forming property Reduction in elastic modulus | Acrylic rubber | (Butyl acrylate)-(ethyl acrylate)-(acrylonitrile) = 30 mol %/30 mol %/40 mol %, molecular weight = 850,000 |  |  |  |  |
|  |  | Polyvinyl butyral resin | Degree of Polymerization = 1700, degree of acetylation = 3 mol % or less, degree of butyralation = 65 mol % or more, flow softening point = 225° C. |  |  |  |  |
|  |  | Phenoxy resin | Bisphenol A backbone, number average molecular weight = 30,000 |  |  |  |  |
|  |  |  | Bisphenol F backbone, weight average molecular weight = 50,000 | 14.2 | 10.1 | 14.2 | 10.1 |
|  |  |  | Fluorene backbone, weight average molecular weight = 50,000 | 14.2 | 10.1 | 14.2 | 10.1 |
|  | Curing component 1 | Epoxy resin | Structural name given as *1 below |  | 30.0 |  | 30.0 |
|  | Curing component 2 | Epoxy resin | Cresol novolac-type epoxy resin, softening point = 80° C. |  | 20.1 |  | 20.1 |
|  | Curing component 4 | Epoxy resin | Liquid bis-A-type epoxy, epoxy equivalent = 180 | 45.7 |  | 45.7 |  |
|  | Curing agent | Phenol novolac | Softening point = 100° C., OH equivalent = 104 | 20.4 | 24.3 | 20.4 | 24.3 |
|  | Addition of adhesiveness 1 | Silane coupling agent | 3-Glycidoxypropyl trimethoxysilane |  | 0.3 |  | 0.3 |
|  | Addition of adhesiveness 2 | Silane coupling agent | N-phenyl-3-aminopropyl trimethoxysilane | 0.50 |  | 0.50 |  |
|  | Curing catalyst | Imidazole | 2-phenyl-4,5-dihydroxyimidazole |  | 0.1 |  | 0.1 |
|  |  | Imidazole | 2-phenyl-4-methylimidazole | 0.01 |  | 0.01 |  |
|  | Curing agent having flux activity | Sebacic acid | HOOC—(CH₂)₉—COOH | 5.0 | 5.0 |  |  |
|  |  | Adipic acid | HOOC—(CH₂)₄—COOH |  |  |  |  |
|  |  |  | HOOC—(CH₂)₁₀—COOH |  |  |  |  |
|  |  | Gentisic acid | 2,5-Dihydroxybenzoic acid |  |  |  |  |
|  |  | Phenolphthalin |  |  |  | 5.0 | 5.0 |
|  |  |  | Total resin | 100.01 | 100.0 | 100.01 | 100.0 |
|  | Conductive particle | Solder powder | Sn/Bi = 42/58, melting point = 138° C., mean particle size = 35 μm | 90 | 90 | 90 | 90 |
|  |  |  | Sn/Bi = 42/58, melting point = 138° C., mean particle size = 20 μm |  |  |  |  |
|  |  |  | Sn/Bi = 42/58, melting point = 138° C., |  |  |  |  |

TABLE 13-continued

| Function | Component | Structure, etc. | Example 15 | Example 16 | Example 17 | Example 18 |
|---|---|---|---|---|---|---|
| | | mean particle size = 12 μm Sn/In = 48/52, melting point = 118° C., mean particle size = 35 μm | | | | |

*1 mixture of 2-[4-(2,3-epoxypropoxy)phenyl]-2[4[1,1-bis [4-(2,3-epoxypropoxy)phenyl]ethyl]phenyl]propane and 1,3-bis[4-[1-[4-(2,3-epoxypropoxy)phenyl]-1-[4-[1-[4-(2,3-epoxypropoxy)phenyl]-1-methyl]ethyl]phenyl]phenoxy]2-propanol

TABLE 14

| | Example 15 | Example 16 | Example 17 | Example 18 |
|---|---|---|---|---|
| Curing temperature ($T_1$) of resin layer | 208 | 212 | 210 | 213 |
| Melting point ($T_2$) of solder powder | 138 | 138 | 138 | 138 |
| Melt viscosity of resin layer | 130 | 140 | 150 | 170 |
| $T_1 - T_2$ | 70 | 74 | 72 | 75 |

TABLE 15

| | | | | Example 15 | Example 16 | Example 17 | Example 18 |
|---|---|---|---|---|---|---|---|
| Results of Evaluation | Contact resistance value between adjacent terminals | Substrate having no solder resist | Measured value(mΩ) | 22 | 20 | 26 | 25 |
| | | | Judgment | ○ | ○ | ○ | ○ |
| | | Substrate having solder resist | Measured value(mΩ) | 21 | 20 | 27 | 27 |
| | | | Judgment | ○ | ○ | ○ | ○ |
| | Formability of conductive column between adjacent terminals | Substrate having no solder resist | Judgment | ○ | ○ | ○ | ○ |
| | | Substrate having solder resist | Judgment | ○ | ○ | ○ | ○ |
| | Ratio of reaction of carboxyl group(s) of curing agent | | | 84 | 86 | 71 | 72 |

The connection resistance could be suppressed to low levels, when the adhesive tapes of Examples were used.

On the contrary, the connection resistance undesirably increased, when the adhesive tapes of Comparative Examples were used.

It was thus confirmed that, low resistance can be realized in a stable manner according to the present invention.

(Evaluation of Wettability on Surface of Copper Interconnects)

In the adhesive tape described in Example 1, species of the solder powder and the curing agent having a flux activity were varied as listed in Table 1. Combinations of materials for the curing agent having a flux activity and the solder powder, and their effects on wettability onto the surface of copper interconnect were evaluated.

As the solder powder, Sn/Pb, Sn/Bi, Sn/Zn/Bi and Sn/Ag/Cu were used. For the individual solder powders, gentisic acid and sebacic acid were used as the curing agent having a flux activity, which can function as a curing catalyst of the epoxy resin. As a consequence, any of these combinations was successful in ensuring a desirable level of wettability. A combination of Sn/Bi and sebacic acid showed the best wettability.

(Examination of Particle Size of Solder Powder)

Particle size of the solder powder in the adhesive tape was varied, and influences thereof on the wettability onto the surface of copper circuit were evaluated. In the adhesive tape described in Example 1, the mean particle size of the solder powder was varied among 12 μm, 20 μm and 35 μm. The amount of addition of the solder powder was adjusted to 20% by weight, assuming the total content of the components other than the solder powder as 100. The adhesive tape was disposed between the substrates having no solder resist layer formed thereon, and then subjected to heat compression bonding at 220° C., under 2 MPa for 600 seconds. All particle sizes were found to ensure wettability onto the surface of the copper interconnects. Larger wettability was obtained for the particle sizes of 35 μm, 20 μm and 12 μm arrayed in a decreasing order.

The invention claimed is:

1. An adhesive tape electrically connecting conductive components, comprising:
   a resin layer containing a thermosetting resin;
   a solder powder; and
   a curing agent,
   wherein said solder powder and said curing agent reside in said resin layer,
   the curing temperature $T_1$ of said resin layer and the melting point $T_2$ of said solder powder satisfy the relational expression (1):

$$T_1 \geq T_2 + 20°\ C. \qquad \text{expression (1)}$$

where said curing temperature $T_1$ is defined as an exothermic peak temperature obtained by measuring said adhesive tape by DSC at a temperature elevation speed of 10° C./minute, and said resin layer shows a melt viscosity of 50 Pa·s or above and 5000 Pa·s or below, at the melting point $T_2$ of said solder powder.

2. The adhesive tape as claimed in claim 1,
wherein said solder powder which resides in said resin migrates under heating towards the surface of said conductive components in a self-aligned manner.

3. A semiconductor package comprising:
a chip mounting substrate; and
first and second semiconductor chips stacked on one surface of said chip mounting substrate,
wherein said first semiconductor chip and said second semiconductor chip are adhered using said adhesive tape as claimed in claim 1.

4. A semiconductor package comprising:
a first substrate on which a semiconductor chip is mounted; and
a second substrate on which said first substrate is mounted,
wherein said first substrate and said second substrate are adhered using said adhesive tape as claimed in claim 1.

5. The adhesive tape as claimed in claim 1,
wherein content of said solder powder is 20 parts by weight or more per 100 parts by weight in total of all components other than said solder powder.

6. The adhesive tape as claimed in claim 5,
wherein mean particle size of said solder powder is 1 μm or larger and 100 μm or smaller.

7. The adhesive tape as claimed in claim 1,
wherein said thermosetting resin contains an epoxy resin which exists as a solid at room temperature, and an epoxy resin which exists as a liquid at room temperature.

8. The adhesive tape as claimed in claim 7,
wherein said epoxy resin which exists as a solid at room temperature contains a solid tri-functional epoxy resin and a cresol-novolac-type epoxy resin, and
said epoxy resin which exists as a liquid at room temperature is a bisphenol-A-type epoxy resin or a bisphenol-F-type epoxy resin.

9. The adhesive tape as claimed in claim 1,
wherein said curing agent is a curing agent having a flux activity.

10. The adhesive tape as claimed in claim 9,
wherein said curing agent having said flux activity is a curing agent containing a carboxyl group.

11. A connected structure comprising:
a pair of conductive components; and
an adhesive tape disposed between said pair of conductive components so as to electrically connect said pair of conductive components,
wherein said adhesive tape is the adhesive tape as claimed in claim 10, and
50% or more of the carboxyl group of said curing agent having a flux activity has reacted with said thermosetting resin.

* * * * *